US012783928B2

(12) United States Patent
Sevriuk et al.

(10) Patent No.: US 12,783,928 B2

(45) Date of Patent: Nov. 3, 2026

(54) TUNABLE DISSIPATIVE CIRCUITS FOR LOW TEMPERATURE FREQUENCY SHIFTERS, AND METHODS FOR MAKING A FREQUENCY SHIFT AT LOW TEMPERATURE

(71) Applicant: IQM FINLAND OY, Espoo (FI)

(72) Inventors: Vasilii Sevriuk, Espoo (FI); Juha Hassel, Espoo (FI); Mikko Möttönen, Espoo (FI)

(73) Assignee: IQM FINLAND OY, Espoo (FI)

( * ) Notice: Subject to any disclaimer, the term of this patent is extended or adjusted under 35 U.S.C. 154(b) by 466 days.

(21) Appl. No.: 18/278,216

(22) PCT Filed: Mar. 4, 2021

(86) PCT No.: PCT/EP2021/055453

§ 371 (c)(1),
(2) Date: Aug. 22, 2023

(87) PCT Pub. No.: WO2022/184259

PCT Pub. Date: Sep. 9, 2022

(65) Prior Publication Data

US 2024/0135225 A1 Apr. 25, 2024

(51) Int. Cl.

*G06N 10/40* (2022.01)
*H03D 7/00* (2006.01)
(Continued)

(52) U.S. Cl.

CPC ............. *G06N 10/40* (2022.01); *H03D 7/005* (2013.01); *H10N 60/10* (2023.02); *H10N 60/82* (2023.02); *H10N 69/00* (2023.02)

(58) Field of Classification Search

CPC ........ H03D 7/005; G06N 10/40; H10N 60/10; H10N 60/82; H10N 69/00
See application file for complete search history.

(56) References Cited

U.S. PATENT DOCUMENTS

| | | | |
|---|---|---|---|
| 10,530,372 | B1 | 1/2020 | Yu et al. |
| 2005/0212604 | A1 | 9/2005 | Cyr et al. |

(Continued)

FOREIGN PATENT DOCUMENTS

| | | | |
|---|---|---|---|
| CA | 3132092 | A1 | 9/2020 |
| CN | 111027701 | A | 4/2020 |

(Continued)

OTHER PUBLICATIONS

Partanen et al., Flux-tunable heat sink for quantum electric circuits, ARXIV.org, Cornell University Library, 201 Olin Library Cornell University Ithaca, NY 14853, Dec. 29, 2017.

(Continued)

*Primary Examiner* — Moazzam Hossain

(74) *Attorney, Agent, or Firm* — Meunier Carlin & Curfman LLC

(57) ABSTRACT

A tunable dissipative circuit is presented for shifting a frequency of a radio frequency signal or microwave signal in a cryogenically cooled environment. One or more couplers make couplings between a propagation path and a tunable resonance element and a controllable dissipator element. A first control input to said tunable resonance element allows changing a resonance frequency of said tunable resonance element with a first control signal. A second control input to said controllable dissipator element allows changing a damping rate of said controllable dissipator element with a second control signal.

10 Claims, 3 Drawing Sheets

(51) Int. Cl.

| | |
|---|---|
| ***H10N 60/10*** | (2023.01) |
| ***H10N 60/82*** | (2023.01) |
| ***H10N 69/00*** | (2026.01) |

(56) References Cited

U.S. PATENT DOCUMENTS

| | | | | |
|---|---|---|---|---|
| 2015/0358026 | A1 | 12/2015 | Gan | |
| 2016/0079968 | A1 | 3/2016 | Strand et al. | |
| 2016/0191060 | A1 * | 6/2016 | McDermott, III | B82Y 10/00 |
| 2018/0138987 | A1 * | 5/2018 | Sliwa | H01P 3/12 |
| 2019/0273197 | A1 * | 9/2019 | Roberts | G06N 10/40 |
| 2022/0014192 | A1 * | 1/2022 | Ahonen | H10N 60/12 |
| 2022/0188683 | A1 * | 6/2022 | Goetz | H03B 15/006 |

FOREIGN PATENT DOCUMENTS

| | | | |
|---|---|---|---|
| CN | 111697926 | A | 9/2020 |
| CN | 107580752 | A | 3/2023 |

OTHER PUBLICATIONS

Wong et al., A tunable quantum dissipator for active resonator reset in circuit QED, ARXIV.org, Cornell University Library, 201 Olin Library Cornell University Ithaca, NY 14853, Jun. 5, 2018.

Partanen et al., Exceptional points in tunable superconducting resonators, Physcial Review B, vol. 100, No. 13, Oct. 13, 2019, pp. 134505-01-134505-17.

International Search Report and Written Opinion issued in PCT/EP2021/055453, mailed Dec. 23, 2021.

Office Action in connection to CN Application No. 202110566070.3, dated Sep. 23, 2024.

Zhou et al. "Microwave resonators for weak light detection at telecom wavelength." Progress In Electromagnetics Research. Jan. 2014.

* cited by examiner

TUNABLE DISSIPATIVE CIRCUITS FOR LOW TEMPERATURE FREQUENCY SHIFTERS, AND METHODS FOR MAKING A FREQUENCY SHIFT AT LOW TEMPERATURE

CROSS REFERENCE TO RELATED APPLICATIONS

The application is a national phase entry under 35 U.S.C. § 371 of International Application No. PCT/EP2021/055453, filed on Mar. 4, 2021.

FIELD OF THE INVENTION

The invention is generally related to circuit QED, i.e. quantum electrodynamics in circuits. In particular, the invention is related to controllably changing the frequency of a radio frequency or microwave signal propagating in a circuit meant for use in low-temperature electronics.

BACKGROUND OF THE INVENTION

Accurately tuned radio frequency or microwave signals are needed in low temperature electronics for many purposes, including but not being limited to controlling the operation of circuit elements and reading out the states of qubits in quantum processing circuits. The attribute "low temperature" refers to the required operating temperature of the electronic devices. It can relate for example to the critical temperature of the superconductor materials involved, or depend on the thermal energy scales as compared to the quantum energy scales of the quantum electronics components involved. Accurately changing the frequency may involve for example performing frequency modulation around a centre frequency or providing frequency switching, for example in systems that rely upon frequency multiplexing.

The traditional way of producing oscillating signals on desired frequencies is to use mixers, but they involve the inherent drawback of creating unwanted sideband signals. In low temperature electronics, additional difficulties arise from the fact that the most important circuits reside in a cryogenically cooled environment. Passing microwave signals between the surrounding room temperature environment and the cryogenically cooled environment is more complicated than using low-frequency or DC signals, so it would be more advantageous if the desired microwave signals at fine-tuned frequencies could be created and handled only within the cryogenically cooled environment.

SUMMARY

It is an objective to present circuits and methods for producing oscillating signals at fine-tuned radio and/or microwave frequencies within a cryogenically cooled environment. Another objective is to combine such production of signals with improved integration level in quantum processing circuits. A further objective is to produce such signals at only modest requirements for interfacing hardware between room temperature and cryogenically cooled environments.

These and further advantageous objectives are achieved by using tunable dissipative circuits that can be made to interact with an oscillating signal in a way that causes a continuous change in the phase of the oscillating signal, effectively resulting in a corresponding change in frequency that depends unambiguously on the control signal(s) used to control the tunable dissipative circuits.

According a first aspect there is provided a tunable dissipative circuit for shifting a frequency of a radio frequency signal or microwave signal in a cryogenically cooled environment. The tunable dissipative circuit comprises one or more couplers for making respective one or more couplings to a propagation path of said radio frequency signal or microwave signal. The tunable dissipative circuit comprises also a tunable resonance element coupled to said propagation path by at least one of said one or more couplers and a controllable dissipator element coupled to said propagation path by at least one of said one or more couplers. A first control input to said tunable resonance element is provided for changing a resonance frequency of said tunable resonance element with a first control signal coupled to said first control input. A second control input to said controllable dissipator element is provided for changing a damping rate of said tunable dissipative circuit with a second control signal coupled to said second control input.

According to an embodiment the tunable resonance element and the controllable dissipator element are the same circuit element, coupled to said propagation path by at least one of said one or more couplers. This involves the advantage that a very concise implementation can be provided with highly optimized component footprints on the substrate of a circuit.

According to an embodiment the tunable resonance element and the controllable dissipator element constitute a series, in which one of said one or more couplers couples the tunable resonance element to said propagation path and another one of said one or more couplers couples the controllable dissipator element to said tunable resonance element. This involves the advantage that the properties and operating characteristics of the different circuit elements can be optimized separately, and previously known component implementations can be used as building blocks.

According to an embodiment the controllable dissipator element comprises a constant dissipator and a controllable coupling that couples said constant dissipator to the tunable resonance element. This involves the advantage that the dissipator part of the circuit can be made relatively simple.

According to an embodiment said tunable resonance element comprises a combination of a constant-frequency resonance part and a part with tunable inductance or capacitance. This involves the advantage that highly accurate and well documented tuning methods can be utilized.

According to an embodiment said part with tunable inductance or capacitance is a SQUID. Said first control input may then comprise an inductor configured to controllably change a magnetic flux through said SQUID. This involves the advantage that an accurate and well documented control method of the tunable resonance element can be utilized.

According to an embodiment said controllable dissipator element comprises a Quantum Circuit Refrigerator, which includes at least one normal conductor—insulator—superconductor junction, hereinafter NIS junction. Said second control input may then comprise a control voltage input for providing a bias voltage to said NIS junction for controlling the probability of photon-assisted electron tunnelling through said NIS junction. This involves the advantage that an accurate and well documented control method of the controllable dissipator element can be utilized.

According to an embodiment the tunable resonance element and the controllable dissipator element are parts of a network of circuit elements that includes also other circuit elements, so that said one or more couplers form couplings between the tunable resonance element, the controllable dissipator element, and said other circuit elements. This involves the advantage that the principle of tuning the frequencies of radio frequency or microwave signals can be utilised in a very flexible way in a variety of different kinds of circuits in low temperature electronics.

According to a second aspect there is provided a quantum processing circuit, which comprises at least one tunable dissipative circuit of the kind described above.

According to an embodiment the quantum processing circuit comprises a controllable circuit element, the controllability of which relies upon at least one of: frequency multiplexing of signals, frequency modulation of signals. The propagating path in the tunable dissipative circuit may then go to or from said controllable circuit element. This involves the advantage that the controllable circuit element can be controlled without the disadvantageous effects associated with mixers.

According to a third aspect there is provided a method for making a frequency shift at a low temperature. The method comprises providing couplings between a propagation path, a tunable resonance element, and a controllable dissipator element in a cryogenically cooled environment. Additionally, the method comprises passing a radio frequency signal or microwave signal through said propagation path and cyclically modulating a resonance frequency and a damping rate of said tunable resonance element at a common modulation frequency that is significantly higher than the modulation amplitudes of the resonance frequency and the damping rate, thus making a shift in the frequency of said radio frequency signal or microwave signal.

According to an embodiment said modulating of the resonance frequency of said tunable resonance element is done by modulating a magnetic flux that passes through a SQUID that forms part of said tunable resonance element. This involves the advantage that an accurate and well documented control method of the tunable resonance element can be utilized.

According to an embodiment, said modulating of the damping rate is done by modulating a bias voltage of at least one normal conductor—insulator—super-conductor junction, hereinafter NIS junction, thus controlling the probability of photon-assisted electron tunnelling through said NIS junction. This involves the advantage that an accurate and well documented control method of the controllable dissipator element can be utilized.

According to an embodiment said modulating of the damping rate is done by modulating the strength of a coupling between a constant dissipator and the tunable resonance element. This involves the advantage that the dissipator part of the circuit can be made relatively simple.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

DETAILED DESCRIPTION

Figure 1:
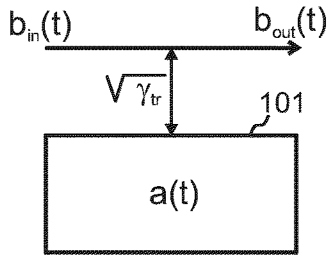
FIG. 1 illustrates an input signal, an output signal, and a first resonator mode signal in a resonator with tunable parameters.

In the schematic representation in FIG. 1 there are the time-dependent, oscillating input and output signals $b_{in}$ (t) and $b_{out}$ (t) as well as the first resonator mode a(t) of a resonator 101. Operating parameters of the resonator 101 are tunable, so the resonator may be referred to as a tunable resonator. The input and output signals $b_{in}$ (t) and $b_{out}$ (t) are coupled to the tunable resonator with a coupling constant $\sqrt{\gamma_{tr}}$. The tunable resonator 101 is tunable both in terms of its resonance frequency and in terms of its damping rate, which last-mentioned quantity may also be called the decay rate and expressed in units of 1/s.

The scientific paper Partanen, M., Goetz, J., Tan, K. Y., Kohvakka, K., Sevriuk, V., Lake, R. E., Kokkoniemi, R., Ikonen, J., Hazra, D., Makinen, A., Hyyppa, E., Gronberg, L., Vesterinen, V., Silveri, M., and Mottonen, M. (2019): "Exceptional points in tunable superconducting resonators", Phys. Rev. B, 100:134505, has shown that when the properties of a system like that in FIG. 1 are analysed in a parameter space, so-called exceptional points may be observed. In general, any linear two-port electrical networks can be described with the scattering parameters or S-parameters $S_{ij}$, where $i \in (1,2)$ and $j \in (1,2)$. The parameter $S_{21}$ of the case shown in FIG. 1 is the ratio $b_{out}/b_{in}$. How it affects the amplitude and phase of the output signal $b_{out}$ (t) may be examined by plotting said amplitude and phase as functions of the resonance frequency and damping rate in the tunable resonator 101.

Figure 2:
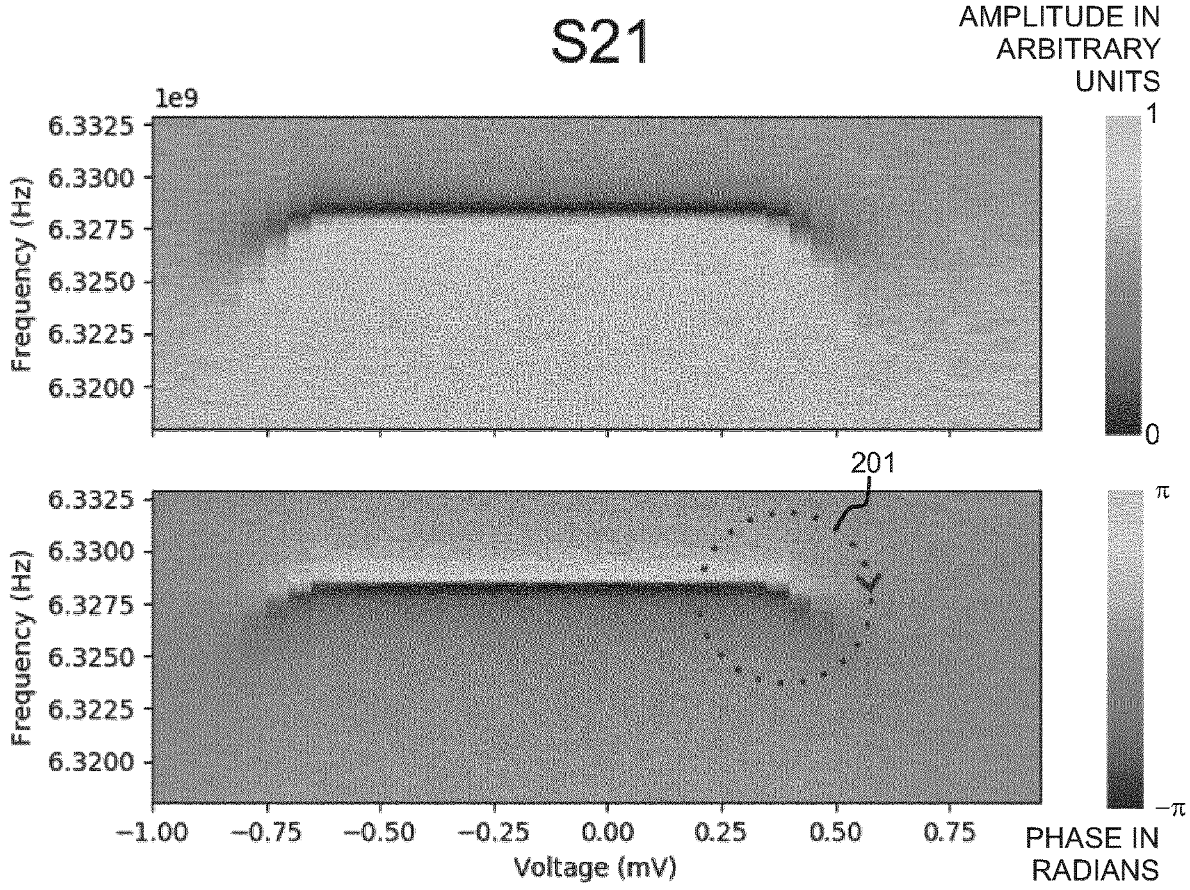
FIG. 2 illustrates actual, measured parameter space representations of the amplitude and phase of an oscillating signal in a system that has exceptional points.

FIG. 2 shows the measured results of an actual experiment in a frequency-plane representation of $S_{21}$. As shown in the legend columns on the right, in the upper field of FIG. 2 the amplitude of the parameter $S_{21}$ is shown encoded with the darkness of the shade of grey, while the lower field is a similar illustration of phase. The horizontal axis is labelled as voltage in millivolts, reflecting the fact that in this experiment a voltage-controlled quantum refrigerator circuit was used to implement the change in damping rate.

An eye-catching characteristic in FIG. 2 is the appearance of a horizontal, line-formed feature in the upper central region of each field. A sharp change of amplitude (in the upper field) and phase (in the lower field) takes place in the vertical direction across the line-formed feature, although concerning phase it must be noted that a phase change from −pi to +pi actually means only crossing the negative x-axis in an x-y phase diagram. Exceptional points appear at each end of the line-formed feature in both fields.

A theoretical model of the tunable resonator 101 can be used to describe how a periodic modulation of its resonance frequency and damping rate will affect the ratio between the input and output signals $b_{in}$ (t) and $b_{out}$ (t) in terms of amplitude and phase.

Assuming an adiabatic case, the system can be described with two quantum optics equations (1a) and (1b)

$$\frac{d}{dt}a(t) = \left(i\omega_r - \frac{1}{2}\gamma_\Sigma\right)a(t) + \sqrt{\gamma_{tr}}\, b_{in}(t), \tag{1a}$$

$$b_{in}(t) + b_{out}(t) = \sqrt{\gamma_{tr}}\, a(t). \tag{1b}$$

The parameters of the resonator are the total damping rate $\gamma_\Sigma$ and the resonance frequency $\omega_r$.

Introducing a sin-formed modulation of the resonance frequency and a cos-formed modulation of the damping rate changes the first equation, so that in the modulated case the equations are $$\frac{d}{dt}a(t) = \left(i\omega_r + i\omega_m\sin(2\pi ft) - \frac{1}{2}\gamma_\Sigma - \frac{1}{2}\gamma_m\cos(2\pi ft)\right)a(t) + \sqrt{\gamma_{tr}}\, b_{in}(t), \tag{2a}$$

$$b_{in}(t) + b_{out}(t) = \sqrt{\gamma_{tr}}\, a(t). \tag{2b}$$

Here $\omega_m$ and $\gamma_m$ are the respective amplitudes of the resonator parameter modulation and f is the frequency of the modulation. Using the sin- and cos-formed modulations causes a 90 degrees phase difference between the damping rate modulation and the resonance frequency modulation. In a two-dimensional parameter space this corresponds to making repeated rounds on a circular path around a point that in the parameter space represents the unmodulated values of the resonance frequency and damping rate. The direction of circulating said path depends simply on the signs selected for the sin- and cos-formed modulations of the resonance frequency and damping rate.

The input signal is an oscillating signal and can thus be written in the form $b_{in}(t)=b_{in0}e^{i\omega t}$. In this case we can write a solution to the differential equation 2a as $$a(t) = \exp\left(-i\frac{\omega_m\cos(2\pi ft)}{2\pi f} + i\omega_r t - \frac{\gamma_m\sin(2\pi ft)}{4\pi f} - \frac{1}{2}\gamma_\Sigma t\right)\left[c_1 + \sqrt{\gamma_{tr}}\, b_{in0}\int_1^t \exp\left(i\frac{\omega_m\cos(2\pi fx)}{2\pi f} - i\omega_r x + \frac{\gamma_m\sin(2\pi fx)}{4\pi f} + \frac{1}{2}\gamma_\Sigma x + i\omega x\right)dx\right] \tag{3}$$

where $c_1$ is an arbitrary constant.

Considering the lower field in FIG. 2, one may encircle the exceptional point at the right-hand end of the horizontal feature (see dotted line 201) by performing a modulation where $\omega=\omega_r$ and $\gamma_{tr}=\gamma_\Sigma/2$. For simplicity, we will also modulate the signal such that $\omega_m=\gamma_m/2$. This enables rewriting the solution (3) as $$a(t) = \exp\left(\frac{1}{4}\left(\frac{-i\cos(2\pi ft)}{\pi f}\gamma_m + (i2\omega_r - \gamma_\Sigma)2t\right)\right)\left[c_1 + \sqrt{\gamma_\Sigma/2}\, b_{in0}\int_1^t \exp\left(\frac{1}{4}\left(\frac{i\cos(2\pi fx) + \sin(2\pi fx)}{\pi f}\gamma_m + 2\gamma_\Sigma x\right)\right)dx\right] \tag{4}$$

We can also assume that the modulation amplitude is much smaller than the frequency of modulation. This assumption allows replacing both exponential functions in equation (4) by the first two terms of the corresponding Taylor series:

$$a(t) = e^{\left(i\omega_r - \frac{1}{2}\gamma_\Sigma\right)t}\left(1 + \frac{-i\cos(2\pi ft) - \sin(2\pi ft)}{4\pi f}\gamma_m\right)\left[c_1 + \sqrt{\gamma_\Sigma/2}\, b_{in0}\int_1^t e^{\frac{1}{2}\gamma_\Sigma x}\left(1 + \frac{i\cos(2\pi fx) + \sin(2\pi fx)}{4\pi f}\gamma_m\right)dx\right] \tag{5}$$

After the integration we can choose the constant $c_1$ such that the solution will acquire the form $$a(t) = \frac{4\sqrt{2}\,\pi f b_{in0}}{(4\pi f + i\gamma_\Sigma)\sqrt{\gamma_\Sigma}}e^{i\omega_r t} + \frac{i\sqrt{2\gamma_\Sigma}\, b_{in0}}{4\pi f + i\gamma_\Sigma}e^{i\omega_r t} - \frac{i\sqrt{2}\,\gamma_m b_{in0}}{(4\pi f + i\gamma_\Sigma)\sqrt{\gamma_\Sigma}}e^{i\omega_r t - i2\pi ft} + \frac{i\sqrt{\gamma_\Sigma}\,\gamma_m^2 b_{in0}}{8\sqrt{2}\,\pi^2 f^2(4\pi f + i\gamma_\Sigma)}e^{i\omega_r t - i4\pi ft} \tag{6}$$

The last term in equation (6) can be neglected, because it contains $(\gamma_m/f)^2$. To fit this solution to the equation 2b we multiply both sides by $\sqrt{\gamma_\Sigma/2}$:

$$a(t)\sqrt{\gamma_\Sigma/2} = b_{in0}e^{i\omega_r t} - \frac{i\gamma_m b_{in0}}{4\pi f + i\gamma_\Sigma}e^{i\omega_r t - i2\pi ft}. \tag{7}$$

This result can now be combined with equation 2b above, remembering that $\gamma_{tr}=\gamma_\Sigma/2$ and $b_{in}(t)=b_{in0}e^{i\omega t}$:

$$b_{in0}e^{i\omega_r t} + b_{out}(t) = b_{in0}e^{i\omega_r t} - \frac{i\gamma_m b_{in0}}{4\pi f + i\gamma_\Sigma}e^{i\omega_r t - i2\pi ft}. \tag{8}$$

It is also possible to look for the output signal in the following form:

$$b_{out}(t) = -\frac{i\gamma_m}{(4\pi f + i\gamma_\Sigma)}b_{in}(t)e^{-i(2\pi f - \omega_r)t}. \tag{9}$$

This result tells us that in the case of adiabatically ($f>>\omega_r$) modulating the parameters of the tunable resonator 101 around the exceptional point ($\omega=\omega_r$, $\gamma_{tr}=\gamma_\Sigma/2$), we effectively increase or decrease the frequency of the output signal by $2\pi f$. The sign (increasing or decreasing) depends on the direction in which the path around the exceptional point is circulated.

Figure 3:
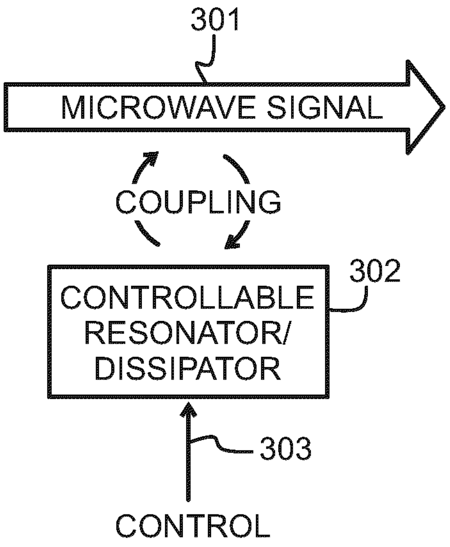
FIG. 3 illustrates a first principle of using tunable dissipative circuits for low temperature frequency shifting.

FIG. 3 illustrates a principle of utilizing the phenomenon explained above to shift a frequency of a radio frequency signal or microwave signal in a cryogenically cooled environment. The signal in question is represented with the arrow 301, and it may be considered to propagate on a propagation path in the cryogenically cooled environment. A coupler of suitable kind is used to make a coupling to the propagation path, so that the circuit element that is shown as a controllable resonator and dissipator 302 in FIG. 3 may have a frequency-switching effect on the signal. A control input 303 is available for changing the characteristics of the controllable resonator and dissipator 302. In particular, one or more control signals brought to the control input 303 may be used to change a resonance frequency and a damping rate in the controllable resonator and dissipator 302. Cyclically modulating the resonance frequency and damping rate at a common modulation frequency causes the desired frequency shift, as explained in the theoretical analysis above, as long as it is made in confortuity with the assumptions: for example, the common modulation frequency is significantly higher than the modulation amplitudes of the resonance frequency and the damping rate.

Figure 4:
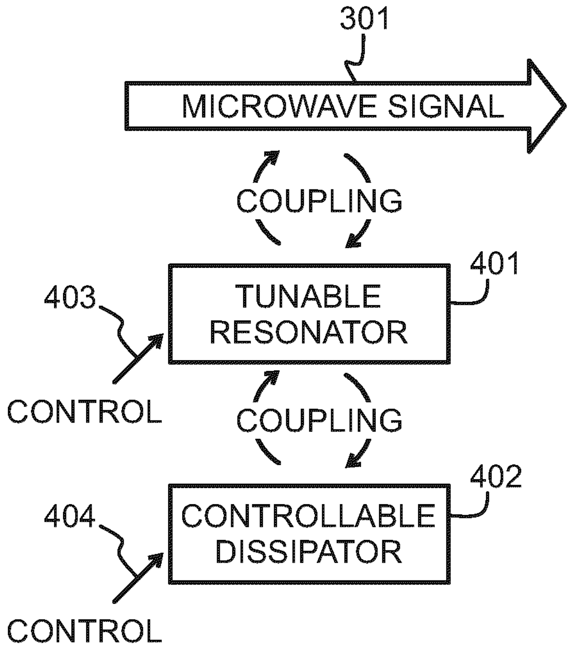
FIG. 4 illustrates a second principle of using tunable dissipative circuits for low temperature frequency shifting.

FIG. 4 illustrates an alternative approach, in which there are two distinctive couplings: one between the propagation path and a tunable resonator 401 and another between the tunable resonator 401 and a controllable dissipator 402. In other words, the tunable resonator 401 and the controllable dissipator 402 constitute a series, in which one coupler couples the tunable resonator 401 to the propagation path and another coupler couples the controllable dissipator 402 to the tunable resonator 401. A first control input 403 is provided for changing the resonance frequency of the tunable resonator 401, and a second control input 404 is provided for changing a damping rate in the controllable dissipator element 402.

Figure 5:
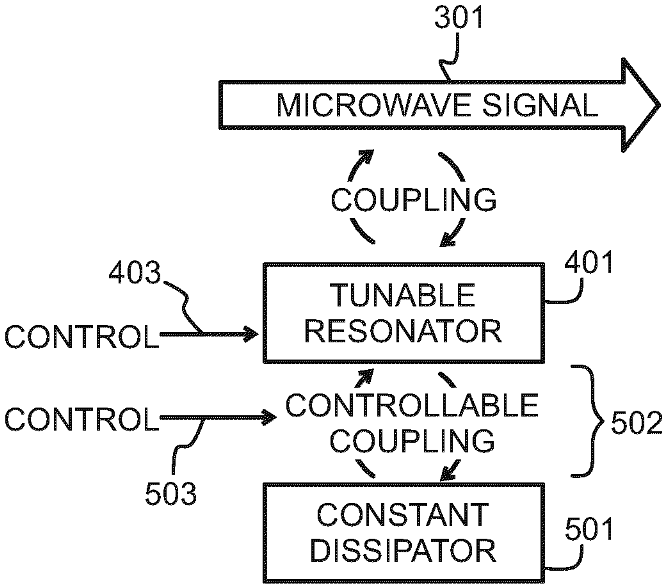
FIG. 5 illustrates a third principle of using tunable dissipative circuits for low temperature frequency shifting.

FIG. 5 illustrates a yet another approach, in which there are the tunable resonator 401 and its control input 403 like in FIG. 4, but the dissipator 501 is a constant dissipator, such as a resistor for example. A controllable coupling 502 couples the constant dissipator 501 to the tunable resonator 401. The control input 503 of the controllable coupling 502 is shown schematically in FIG. 5.

In general, FIGS. 3 to 5 represent a principle according to which there are one or more couplers for making respective one or more couplings to a propagation path of a signal, which may be a radio frequency signal or a microwave signal. There are a tunable resonance element and a controllable dissipator element, each coupled to the propagation path by at least one of said one or more couplers. The tunable resonance element and controllable dissipator element may be or consist of separate elements like in FIGS. 4 and 5, or they may be functionalities of a common element like in FIG. 3. There are control inputs for changing a resonance frequency of the tunable resonance element and a damping rate of the controllable dissipator element. These may involve separate first and second control inputs like in FIGS. 4 and 5, or the first and second control input may be functionalities of a common control input like in FIG. 3.

Figure 6:
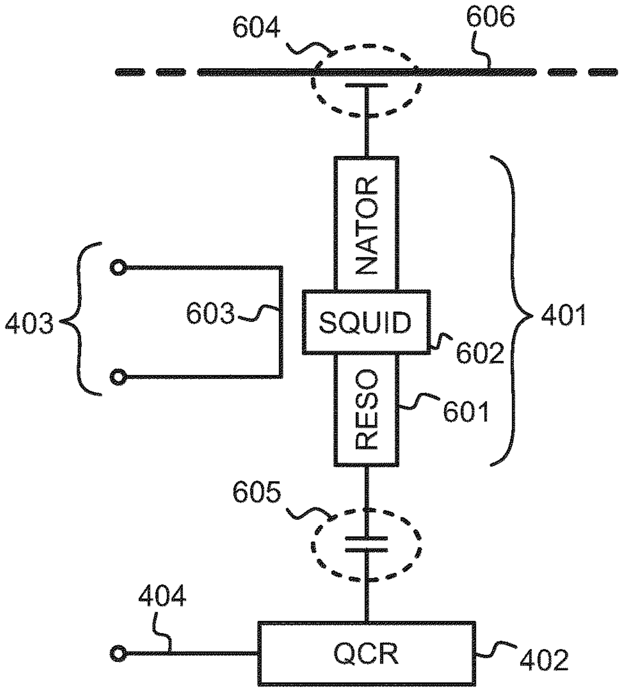
FIG. 6 illustrates a tunable dissipative circuit that can be used for low temperature frequency shifting.

FIG. 6 illustrates circuit elements in an example of a tunable dissipative circuit for shifting a frequency of a radio frequency signal or microwave signal in a cryogenically cooled environment. It is well known as such that a tunable resonance element may comprise a combination of a constant-frequency resonance part and a part with tunable inductance or capacitance. In the embodiment shown in FIG. 6 this principle is applied by providing a tunable resonator 401, parts of which are a resonator 601 of constant resonance frequency (such as a coplanar waveguide resonator for example) and a SQUID 602. The SQUID 602 may comprise a superconducting loop interrupted by Josephson junctions.

Corresponding to the first control input 403 there is shown an inductor 603 configured to controllably change a magnetic flux through the SQUID 602. In practice the inductor 603 may be as simple as a super-conductive line running close to the SQUID 602, because an electric current flowing through such line will induce a local magnetic field that changes the magnetic flux through the superconducting loop in the SQUID sufficiently to cause the desired change in its inductance. Additionally or alternatively, it is possible to use other kinds of inductors, for examples ones that create a macroscopic-scale magnetic field across a larger part of the quantum processing circuit or even the whole cryogenically cooled region.

Strictly speaking, the SQUID creates some non-linearity to the harmonic resonator. However, in this kind of application one only needs to tune the resonance frequency of the tunable resonator 401 in a narrow range; it is also not mandatory to aim at a very high Q-factor of the resonator and/or high powers of the driving signal, so the non-linearity should not cause problems. In other words, the anharmonicity brought about by the non-linearity will be low enough to be neglected in practice.

In the embodiment shown in FIG. 6 the controllable dissipator element 402 comprises a Quantum Circuit Refrigerator, or QCR for short. A QCR is a circuit element that comprises at least one normal conductor—insulator—superconductor junction, called a NIS junction. One or more of such NIS junction(s) in the QCR may be part of a superconductor—insulator—normal conductor—insulator—superconductor junction, known as a SINIS junction. The second control input 404 comprises a control voltage input for providing a bias voltage to the NIS (or SINIS) junction for controlling the probability of photon-assisted electron tunnelling through said NIS (or SINIS) junction. A QCR of this kind has been thoroughly described for example in the patent application published as EP3398213, which is incorporated herein by reference.

The couplers 604 and 605 are capacitive couplers in the embodiment of FIG. 6. Of these, coupler 604 implements the coupling between the transmission line 606 (i.e. the propagation path of the radio frequency signal or microwave signal) and the tunable resonator 401, while coupler 605 implements the further coupling between the tunable resonator 401 and the QCR 402.

Figure 7:
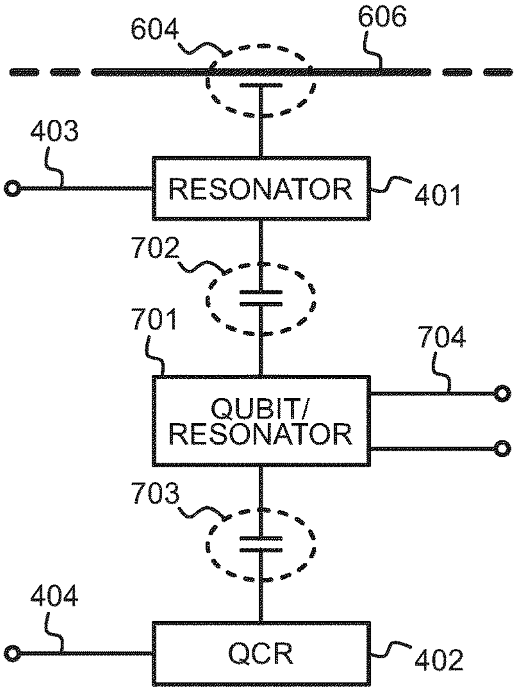
FIG. 7 illustrates another tunable dissipative circuit that can be used for low temperature frequency shifting.

FIG. 7 serves as a reminder that the tunable resonance element (tunable resonator 401) and the controllable dissipator element (QCR 402) may be parts of a network of circuit elements that includes also other circuit elements. In such a network of circuit elements, the couplers mentioned earlier form couplings between the tunable resonance element, the controllable dissipator element, and any other circuit elements of the network. In the example of FIG. 7, there is one additional circuit element 701 in the network, coupled between the tunable resonator 401 and the QCR 402 by the couplers 702 and 703. The additional circuit element 701 may comprise for example a qubit and/or a resonator. It may have further connections 704 to other parts of the system, such as the signal input, signal output, and readout control lines of a qubit, for example. The additional circuit element 701 could be used as the controllable coupler referred to earlier in the description of FIG. 5. In such a case the QCR at the lowest part of FIG. 7 could be replaced with a constant dissipator, and the control input 404 could be left out.

Figure 8:
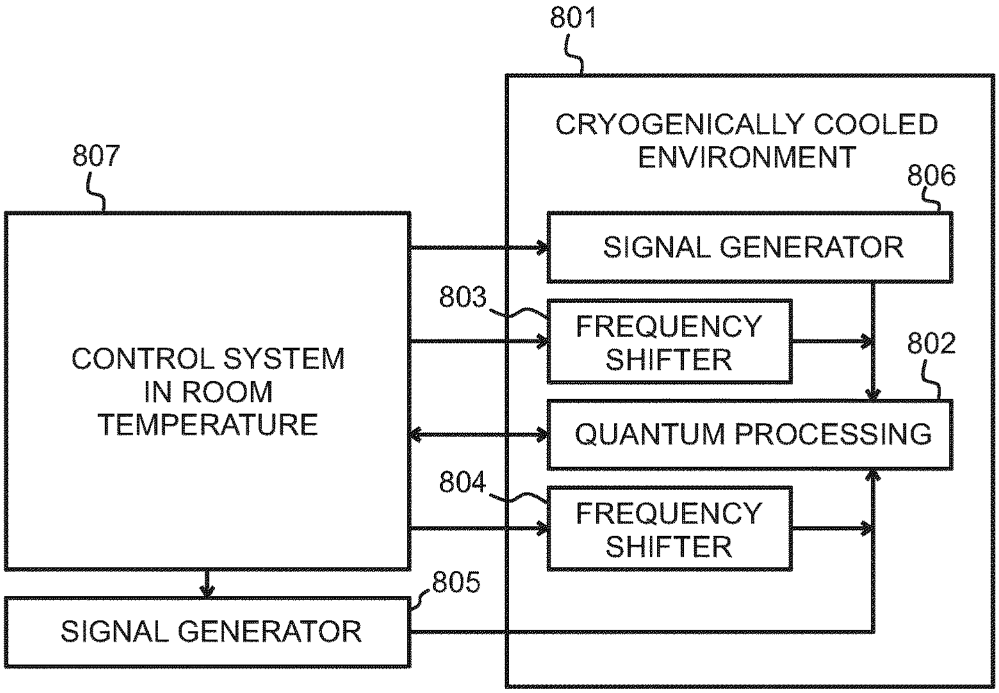
FIG. 8 illustrates parts of a quantum processing system.

A quantum processing circuit according to an embodiment comprises at least one tunable dissipative circuit of at least one kind described above. FIG. 8 illustrates schematically an example, in which a quantum processing circuit is located in a cryogenically cooled environment 801. The quantum processing circuit comprises at least one controllable circuit element 802, the controllability of which relies upon frequency multiplexing of signals and/or frequency modulation of signals. At least some of these are produced with one or more tunable dissipative circuits, so one or more examples of what is called the propagation path of a radio frequency signal or microwave signal above goes to or from the controllable circuit element 802. The tunable dissipative circuits are shown as the frequency shifters 803 and 804.

FIG. 8 shows two examples of where the radio frequency signal or microwave signal, the frequency of which is subsequently shifted, may come from. As schematically shown with the signal generator 805, the original radio frequency signal or microwave signal may come from the room temperature environment. As an alternative, the origin of the radio frequency signal or microwave signal may be a signal generator 806 in the cryogenically cooled environment. A control system 807 in the room temperature environment is shown as providing the control signals to the controllable parts of the system.

It is obvious to a person skilled in the art that with the advancement of technology, the basic idea of the invention may be implemented in various ways. The invention and its embodiments are thus not limited to the examples described above, instead they may vary within the scope of the claims.

The invention claimed is:

1. A tunable dissipative circuit for shifting a frequency of a radio frequency signal or microwave signal in a cryogenically cooled environment, the tunable dissipative circuit comprising:

one or more couplers for making respective one or more couplings to a propagation path of said radio frequency signal or microwave signal, a tunable resonance element coupled to said propagation path by at least one of said one or more couplers between the tunable resonance element and the propagation path, a controllable dissipator element coupled to said propagation path by at least one of said one or more couplers, a first control input to said tunable resonance element for changing a resonance frequency of said tunable resonance element with a first control signal coupled to said first control input, and a second control input to said controllable dissipator element for changing a damping rate of said tunable dissipative circuit with a second control signal coupled to said second control input.

2. The tunable dissipative circuit according to claim 1, wherein:

the tunable resonance element and the controllable dissipator element are the same circuit element, coupled to said propagation path by at least one of said one or more couplers.

3. The tunable dissipative circuit according to claim 1, wherein:

the tunable resonance element and the controllable dissipator element constitute a series, in which one of said one or more couplers couples the tunable resonance element to said propagation path and another one of said one or more couplers couples the controllable dissipator element to said tunable resonance element.

4. The tunable dissipative circuit according to claim 1, wherein:

the controllable dissipator element comprises a constant dissipator and a controllable coupling that couples said constant dissipator to the tunable resonance element.

5. The tunable dissipative circuit according to claim 1, wherein:

said tunable resonance element comprises a combination of a constant-frequency resonance part and a part with tunable inductance or capacitance.

6. The tunable dissipative circuit according to claim 5, wherein:

said part with tunable inductance or capacitance is a SQUID, and said first control input comprises an inductor configured to controllably change a magnetic flux through said SQUID.

7. The tunable dissipative circuit according to claim 1, wherein:

said controllable dissipator element comprises a Quantum Circuit Refrigerator, which includes at least one normal conductor-insulator-superconductor junction, hereinafter NIS junction, and said second control input comprises a control voltage input for providing a bias voltage to said NIS junction for controlling the probability of photon-assisted electron tunnelling through said NIS junction.

8. The tunable dissipative circuit according to claim 1, wherein:

the tunable resonance element and the controllable dissipator element are parts of a network of circuit elements that includes also other circuit elements, so that said one or more couplers form couplings between the tunable resonance element, the controllable dissipator element, and said other circuit elements.

9. A quantum processing circuit comprising at least one tunable dissipative circuit according to claim 1.

10. The quantum processing circuit according to claim 9, wherein:

the quantum processing circuit comprises a controllable circuit element, the controllability of which relies upon at least one of: frequency multiplexing of signals, frequency modulation of signals, and the propagating path in the tunable dissipative circuit goes to or from said controllable circuit element.

* * * * *